(12) United States Patent
McGahay et al.

(10) Patent No.: US 10,109,600 B1
(45) Date of Patent: Oct. 23, 2018

(54) CRACKSTOP STRUCTURES

(71) Applicant: GLOBALFOUNDRIES INC., Grand Cayman (KY)

(72) Inventors: Vincent J. McGahay, Poughkeepsie, NY (US); Nicholas A. Polomoff, Irvine, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/702,316

(22) Filed: Sep. 12, 2017

(51) Int. Cl.
| | |
|---|---|
| *H01L 23/48* | (2006.01) |
| *H01L 23/00* | (2006.01) |
| *H01L 23/66* | (2006.01) |
| H01L 21/3105 | (2006.01) |
| H01L 21/311 | (2006.01) |
| H01L 21/768 | (2006.01) |

(52) U.S. Cl.
CPC ............ *H01L 23/562* (2013.01); *H01L 23/66* (2013.01); *H01L 21/31055* (2013.01); *H01L 21/31116* (2013.01); *H01L 21/76802* (2013.01); *H01L 21/76877* (2013.01)

(58) Field of Classification Search
CPC . H01L 23/562; H01L 23/66; H01L 21/31055; H01L 21/3116; H01L 21/76802; H01L 21/76877
See application file for complete search history.

(56) References Cited

U.S. PATENT DOCUMENTS

| | | | |
|---|---|---|---|
| 6,943,063 B2 | 9/2005 | Tsai et al. | |
| 7,893,459 B2 | 2/2011 | Wang et al. | |
| 8,242,586 B2 | 8/2012 | Chang et al. | |
| 8,803,290 B2 | 8/2014 | Frederick et al. | |
| 9,397,054 B2 * | 7/2016 | Daubenspeck | ... H01L 21/76802 |
| 2009/0035480 A1 * | 2/2009 | Huang | ..................... H01L 21/78 |
| | | | 427/508 |
| 2015/0069609 A1 * | 3/2015 | Farooq | ................... H01L 23/562 |
| | | | 257/741 |

OTHER PUBLICATIONS

Gambino et al., "Reliability of Segmented Edge Seal Ring for RF Devices", 2014 IEEE, 4 pages.

* cited by examiner

*Primary Examiner* — Julio J Maldonado
*Assistant Examiner* — Andre' C Stevenson
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to continuous crackstop structures and methods of manufacture. The structure includes a continuous crackstop having a wall which switches back (switchbacks) on itself multiple times to form an enclosure about an active area of a chip.

20 Claims, 3 Drawing Sheets

CRACKSTOP STRUCTURES

FIELD OF THE INVENTION

The present disclosure relates to semiconductor structures and, more particularly, to crackstop structures and methods of manufacture.

BACKGROUND

Crackstop structures are formed in dielectric material around an active area of a chip to prevent cracks from propagating into the active area. More specifically, crackstops are placed at the perimeter of chips to prevent propagation of dicing damage to active areas.

For technologies with low-k dielectrics, crackstops are formed as continuous metal walls to act as moisture/oxidation barriers. Continuous metal crackstops, though, can create electrical noise coupling within chips intended for certain RF applications. That is, induced currents in continuous crackstops interfere with RF devices by enabling noise coupling.

To stop this noise coupling, it is possible to make the crackstops discontinuous. Specifically, when the continuous loop is broken, e.g., is discontinuous, signals reaching the ends of the discontinuous crackstops encounter an open circuit termination/impedance discontinuity, reducing noise coupling. However, such structures are incompatible with low-k dielectrics because they allow moisture penetration.

SUMMARY

In an aspect of the disclosure, a structure comprises a continuous crackstop having a wall which switches back (switchbacks) on itself multiple times to form an enclosure about an active area of a chip.

In an aspect of the disclosure, a structure comprises a crackstop having a wall which comprises multiple switchbacks to form an enclosure about an active area of a chip and which behaves electrically like a discontinuous crackstop.

In an aspect of the disclosure, a crackstop structure comprises metal walls which switch back on themselves at plural sides and multiple times, and which behave electrically like a discontinuous crackstop.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to crackstop structures and methods of manufacture. More specifically, the present disclosure is directed to RF compatible continuous (and non-continuous) crackstop structures which have metal wires or rails that switch back upon themselves. Advantageously, the crackstop structures described herein are designed to behave electrically like a discontinuous crackstop, enabling low-k dielectrics for RF applications.

In embodiments, the RF compatible crackstop structures can be used at any wiring level. Preferably, through, the RF compatible continuous crackstop structures are used in low-k dielectric wiring levels. In embodiments, the crackstop structures have switchbacks and extensions, which act as segmented or discontinuous areas (e.g., broken). For example, the crackstop structures are comprised of a metal wall which switches back on itself one or multiple times to form a complex polygonal enclosure. In this way, the ends (e.g., walls at the switchbacks) appear to extend to infinity, making it difficult to determine if they are broken or shorted and, hence effectively making them act like they are broken. Accordingly, the switchbacks can act as impedance discontinuities without an open circuit condition.

The crackstop structures of the present disclosure can be manufactured in a number of ways using a number of different tools. In general, though, the methodologies and tools are used to form structures with dimensions in the micrometer and nanometer scale. The methodologies, i.e., technologies, employed to manufacture the crackstop structures of the present disclosure have been adopted from integrated circuit (IC) technology. For example, the structures are built on wafers and are realized in films of material patterned by photolithographic processes on the top of a wafer. In particular, the fabrication of the crackstop structures uses three basic building blocks: (i) deposition of thin films of material on a substrate, (ii) applying a patterned mask on top of the films by photolithographic imaging, and (iii) etching the films selectively to the mask.

Figure 1:
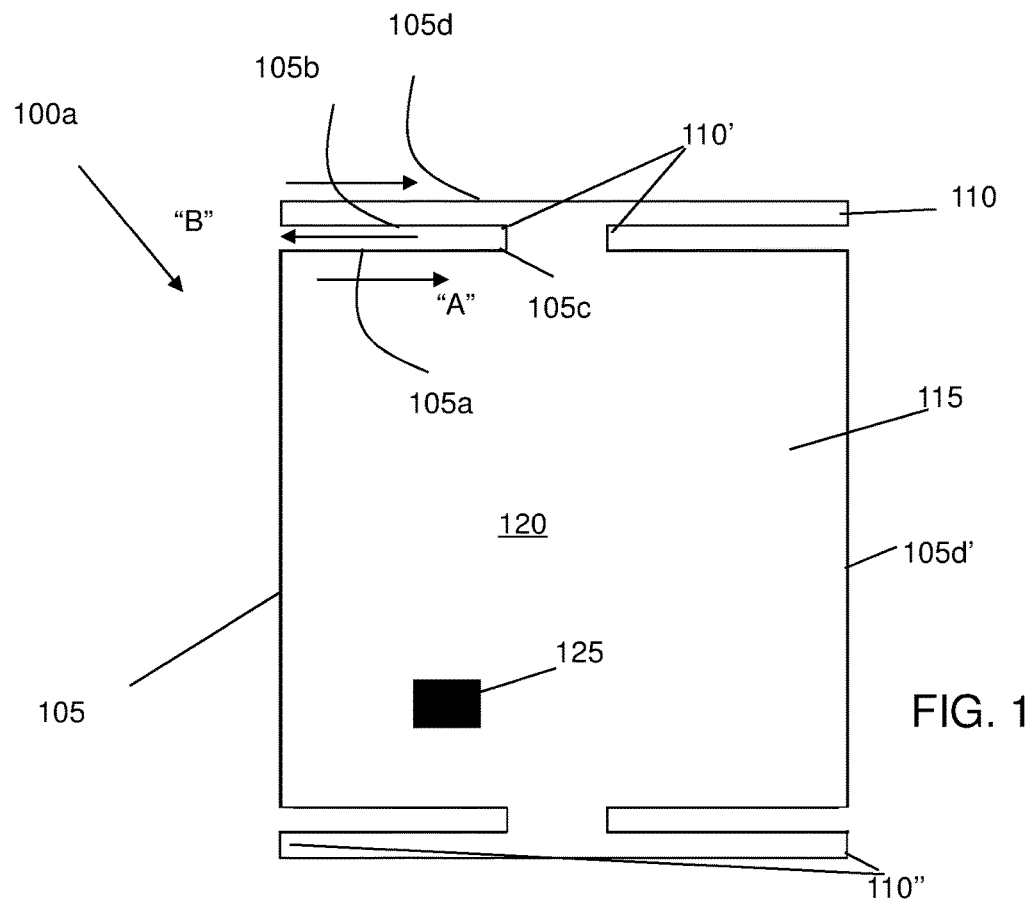
FIG. 1 shows a top plan view of a continuous crackstop structure with switchbacks and respective fabrication processes in accordance with aspects of the present disclosure.

FIG. 1 shows a top plan view of a continuous crackstop structure with switchbacks and respective fabrication processes in accordance with aspects of the present disclosure. More specifically, the continuous crackstop structure 100a includes metal walls or rails 105, with a plurality of switchbacks 110 fabricated within a dielectric material 115 (e.g., low-k dielectric material). The walls or rails 105 and the plurality of switchbacks 110 of the continuous crackstop structure 100a can be fabricated through multiple layers of dielectric material 115 of an integrated circuit, e.g., different metal layers as described further herein.

In embodiments, the continuous crackstop structure 100a forms a complex polygonal enclosure surrounding an active area 120 of a chip. The active area 120 can include a plurality of active and/or passive components as represented by reference numeral 125. These active and/or passive components 125 can include, for example, transistors, resistors, capacitors, wiring layers, etc., fabricated using conventional CMOS technologies as should be understood by those of skill in the art.

As used herein, switchbacks 110 comprise a continuous metal wall 105 which switches back on itself, e.g., to form a multiple metal walls extending in different directions. For example, referring still to FIG. 1, a first metal wall 105a extends in a first direction "A" and a second metal wall 105b extends in another direction "B", with a metal wall 105c providing the switch back between the metal walls 105a, 105b. These switchbacks 110 can occur multiple times within the continuous crackstop structure 100a, e.g., a third metal wall 100d can extend in the direction "A", switching back from metal wall 100b. Although FIG. 1 shows that the metal walls 105a, 105b, 105c, 105d are disposed at 90° to form the switchbacks 110, other angles are also contemplated in any of the embodiments described herein.

Still referring to FIG. 1 and in more specific embodiments, the plurality of switchbacks can be placed at various locations throughout the continuous crackstop structure 100a. For example, in the embodiment shown in FIG. 1, two switchbacks 110' (e.g., a set of switchbacks) are provided in the approximate middle of the walls 105, on opposing ends (two sides). These switchbacks 110' are provided at an inner portion of the continuous crackstop structure 100a, within the active area 120. Additional switchbacks 110" can be provided at the corners of the continuous crackstop structure 100a, leading to a single wall 105d' without interruption (e.g., without the switchbacks) on the sides of the continuous crackstop structure 100a.

In this configuration, three walls 105a, 105b, 105d are provided (e.g., in parallel) on the sides of the continuous crackstop structure 100a that have the switchbacks, with the outermost wall 105d running a full extent of the side of the continuous crackstop structure 100a. Accordingly, it should be understood that in this and other configurations, the walls will be of different lengths on different sides of the continuous crackstop structure 100a, depending on the location of the switchbacks. It should also be recognized by those of skill in the art, that depending on the orientation of the chip, the switchbacks 110' can be provided on the horizontal extent or vertical extent of the continuous crackstop structure 100a (or combinations thereof). Also, in this and other configurations described herein, the switchbacks make the walls appear to be broken effectively acting as impedance discontinuities without an open circuit condition.

Figure 2:
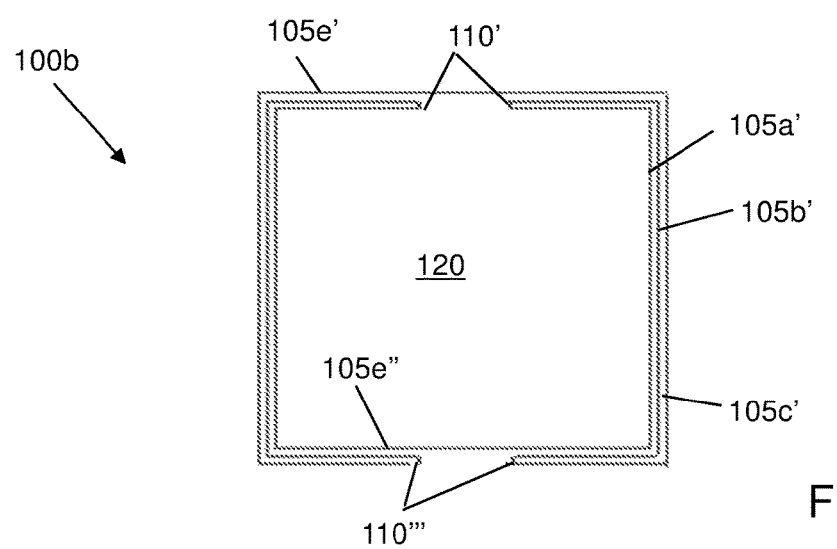
FIG. 2 shows a top plan view of a continuous crackstop structure with switchbacks and respective fabrication processes in accordance with additional aspects of the present disclosure.

FIG. 2 shows a top plan view of a continuous crackstop structure with switchbacks and respective fabrication processes in accordance with additional aspects of the present disclosure. In the continuous crackstop structure 100b of FIG. 2, switchbacks 110', 110''' (e.g., two sets of switchbacks) are provided in the approximate middle of the walls 105, on opposing ends (two sides). In this embodiment, the switchbacks 110' (e.g., a set of switchbacks) are provided within an inner portion of the continuous crackstop structure 100b (within the active area 120); whereas, the switchbacks 110''' (e.g., a set of switchbacks) are provided on an outer portion of the continuous crackstop structure 100b. Again, it should be recognized by those of skill in the art that depending on the orientation of the chip the switchbacks 110', 110''' can be provided on the horizontal extent or vertical extent of the continuous crackstop structure 100b (or combinations thereof).

In this configuration, three walls 105a', 105b', 105c' are provided (e.g., in parallel) on the sides of the continuous crackstop structure 100b that do not have the switchbacks, effectively allowing the walls to run a full extent of the side of the continuous crackstop structure 100b. In addition, three walls 105a', 105b', 105e' (or 105e") are provided (e.g., in parallel) on the sides of the continuous crackstop structure 100b that have the switchbacks, with the outermost wall 105e' and inner most wall 105e" running a full extent of the side of the continuous crackstop structure 100b. It should be recognized that due to the location and configuration of the switchbacks 110', 110''', the outermost wall 105e' is partially shielded from the active area 120; whereas, the inner wall 105e" is fully in the active area 120, blocking the switchbacks 110'''. Also, the continuous crackstop structure 100b forms a complex polygonal enclosure surrounding the active area 120.

Figure 3:
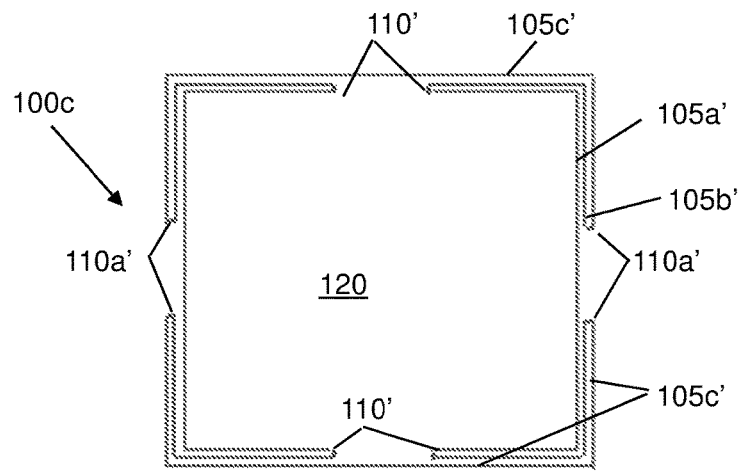
FIG. 3 shows a top plan view of a continuous crackstop structure with switchbacks and respective fabrication processes in accordance with additional aspects of the present disclosure.

FIG. 3 shows a top plan view of another continuous crackstop structure in accordance with additional aspects of the present disclosure. In the continuous crackstop structure 100c of FIG. 3, switchbacks 110' (e.g., two sets of switchbacks) are provided in the approximate middle of the walls 105, on opposing ends (two sides), similar to that described with FIG. 1. In addition, switchbacks 110a' (e.g., two sets of switchbacks) are provided in the approximate middle of the walls 105, on the other opposing ends (two sides). In this embodiment, the switchbacks 110' are provided within an inner portion of the continuous crackstop structure 100c (within the active area 120); whereas, the switchbacks 110a' are provided on an outer portion of the continuous crackstop structure 100c, blocked by the wall 105a'.

In this configuration, three walls 105a', 105b', 105c' are provided (e.g., in parallel) on all the sides of the continuous crackstop structure 100c. In this embodiment, the inner most walls 105a' on the sides of the switchbacks 110a', effectively run a full extent of the side of the continuous crackstop structure 100c. Also, in this embodiment, the outermost walls 105c' on the sides of the switchbacks 110', effectively run a full extent of the side of the continuous crackstop structure 100c. Accordingly, in the embodiment shown in FIG. 3, it should be understood that in this and other configurations, (i) the walls 105 will be of different lengths on different sides of the continuous crackstop structure 100a, (ii) the switchbacks make the walls appear to be broken effectively acting as impedance discontinuities without an open circuit condition, and (iii) the crackstop structure 100c forms a complex polygonal enclosure surrounding the active area 120.

Figure 4:
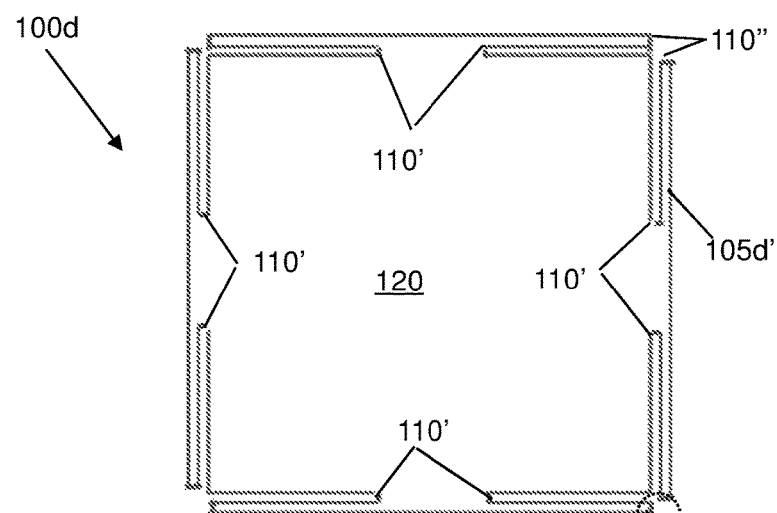
FIG. 4 shows a top plan view of a continuous crackstop structure with switchbacks and respective fabrication processes in accordance with additional aspects of the present disclosure.

FIG. 4 shows a top plan view of another continuous crackstop structure in accordance with additional aspects of the present disclosure. In this continuous crackstop structure 102d, two switchbacks 110' are provided in the approximate middle of the walls 105, on each of the sides of the continuous crackstop structure 102d. Similar to that discussed with respect to FIG. 1, these switchbacks 110' are provided within an inner portion of the continuous crackstop structure 100d, within the active area 120. Additional two switchbacks 110" can be provided at each of the corners of each side of the continuous crackstop structure 100a, leading to a single outer wall 105d', e.g., without the switchbacks, on all of the sides of the continuous crackstop structure 100d. Also, the continuous crackstop structure 100d forms a complex polygonal enclosure surrounding the active area 120.

Figures 4A, 4B, 4C:
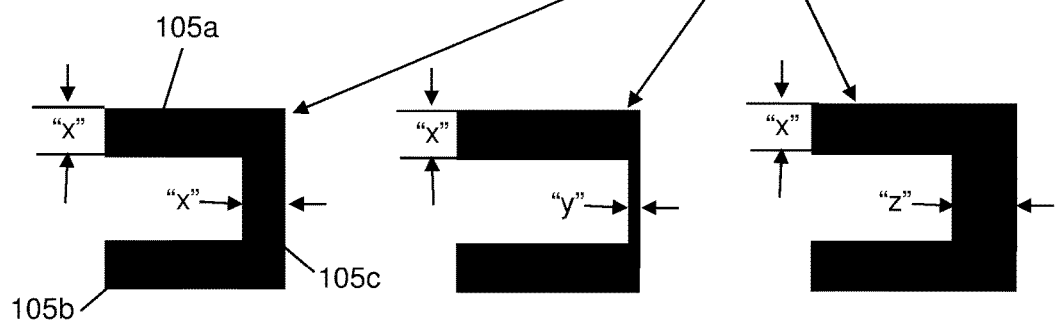
FIG. 4A shows a top plan view of a switchback in accordance with aspects of the present disclosure.
FIG. 4B shows a top plan view of another switchback in accordance with aspects of the present disclosure.
FIG. 4C shows a top plan view of yet another switchback in accordance with aspects of the present disclosure.

FIGS. 4A-4C show modified widths of the walls which comprise the switchback It should be recognized that the modified widths of the switchback can be implemented in any combination with any of the embodiments described in FIGS. 1-4. As shown in FIGS. 4A-4C, the walls of the continuous crackstop structures can have varying widths, e.g., the switchbacks can differ from the width of the main runs of the metal wall in order to introduce characteristic impedance discontinuities, e.g., prevent signal propagation that leads to noise coupling on the chip. In addition, the continuous crackstop structures can have a variety of switchback widths which will provide enhanced disruption of signal propagation in the metal wall and, hence, enhance characteristic impedance discontinuity.

For example, in FIG. 4A, the switchback includes metal walls all of the same width "x". In FIG. 4B, though, the width of metal walls for the main runs, e.g., walls 105a, 105b shown in FIG. 1, are of a first width "x" and the wall that provides connection between the main runs, e.g., wall 105c of FIG. 1, is a second width "y", with "x">"y". In this way, the walls have a different resistance (due to the different widths), which changes the signal impedance, destroying the signal. In FIG. 4C, the width of metal walls for the main runs, e.g., walls 105a, 105b shown in FIG. 1, are of a first width "x" and the wall that provides connection between the main runs, e.g., wall 105c of FIG. 1, is a second width "z", with "x"<"z". As any combination of widths can be used, it should be recognized that "x"≠"y"≠"z", resulting in more signal disruptions and enhanced characteristic impedance discontinuity which effective prevents signal propagation that would lead to noise coupling on the chip.

Figure 5:
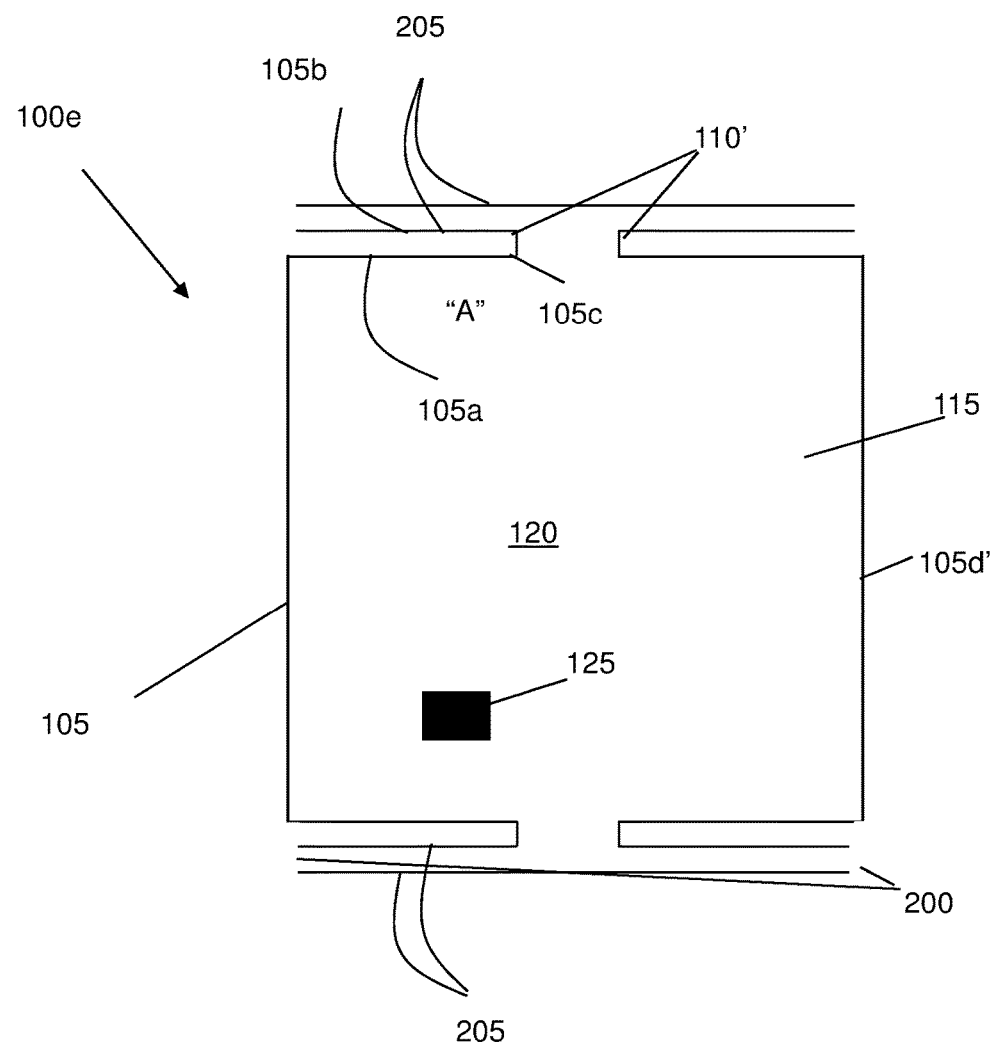
FIG. 5 shows a top plan view of a crackstop structure with switchbacks and extensions and respective fabrication processes in accordance with additional aspects of the present disclosure.

FIG. 5 shows a top plan view of a crackstop structure with switchbacks and extension in accordance with additional aspects of the present disclosure. In FIG. 5, the crackstop structure 100e includes metal walls 105, with a plurality of switchbacks 110' similar to that described with respect to FIG. 1. In this implementation, though, there are no switchbacks at the corners of the crackstop structure 100e; instead, the crackstop structure 100e is segmented as shown at reference numeral 200. The segmentation results in extensions 205, which are metal walls that have ends which do not connect to one another. Note, though, that the outside extension 105 (e.g., metal wall) will still act as a crackstop as it is blocking the switchbacks 110' from the outside of crackstop structure 100e.

In this configuration, three walls 105a, 105b, 105d are provided (e.g., in parallel) on the sides of the crackstop structure 100e that have the switchbacks, with the outermost wall 105d running a full extent of the side of the crackstop structure 100e. Accordingly, in this configuration the segments, e.g., broken ends, and switchbacks, which make the walls appear to be broken, acts as impedance discontinuities. This embodiment can be used at any layer of the integrated circuit.

Referring to each of FIGS. 1-5, in embodiments, the crackstop structures can be formed by conventional CMOS techniques during the fabrication of the different wirings and via interconnects. For example, taking a single metallization level as an illustration, the metallization structures, e.g., wiring structures, interconnect structures, crackstop structures, etc., can be formed by conventional lithography, etching and deposition methods known to those of skill in the art. More specifically, a resist formed over insulator material 115 (at the particular level of the integrated circuit) is exposed to energy (light) to form a pattern (opening). An etching process with a selective chemistry, e.g., reactive ion etching (RIE), will be used to form one or more trenches in the insulator material 115 through the openings of the resist. The trenches will coincide with the shape of the walls 105 and plurality of switchbacks 110. Following the resist removal, the conductive material, e.g., tungsten, etc., can be deposited by any conventional deposition processes, e.g., chemical vapor deposition (CVD) processes. Any residual material on the surface of the insulator material 115 can be removed by conventional chemical mechanical polishing (CMP) processes.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a continuous crackstop having a wall which switches back (switchbacks) on itself multiple times to form an enclosure about an active area of a chip.

2. The structure of claim 1, wherein the continuous crackstop is a polygonal enclosure.

3. The structure of claim 1, wherein the switchbacks are provided on opposing sides of the continuous crackstop.

4. The structure of claim 3, wherein the switchbacks are provided on corners of the continuous crackstop.

5. The structure of claim 3, wherein a first set of the switchbacks are provided within the active area and a second set of the switchbacks are blocked from the active area by another wall of the continuous crackstop.

6. The structure of claim 3, wherein the switchbacks are provided on each corner of the continuous crackstop.

7. The structure of claim 1, wherein the switchbacks are provided on each side of the continuous crackstop, wherein two sets of the switchbacks are within the active area and two sets of the switchbacks are blocked from the active area by another wall of the continuous crackstop.

8. The structure of claim 1, wherein the switchbacks are provided on each side of the continuous crackstop, wherein all of the switchbacks are provided within the active area.

9. The structure of claim 1, wherein the walls of the switchbacks have a same width.

10. The structure of claim 1, wherein the walls of the switchbacks have a different width.

11. A structure comprising a crackstop having a wall which comprises multiple switchbacks to form an enclosure about an active area of a chip and which are structured to behave electrically like a discontinuous crackstop.

12. The structure of claim 11, wherein the switchbacks are provided on opposing sidewalls of the crackstop and on corners of the crackstop.

13. The structure of claim 12, wherein a first set of the switchbacks are provided within the active area and a second set of the switchbacks are blocked from the active area by another wall of the continuous crackstop.

14. The structure of claim 13, wherein the switchbacks are provided on each side of the continuous crackstop.

15. The structure of claim 14, wherein two sets of the switchbacks are within the active area and two sets of the switchbacks are blocked from the active area by another wall of the continuous crackstop.

16. The structure of claim 14, wherein all of the switchbacks are provided within the active area and further comprising additional switchbacks at all of the corners of the enclosure.

17. The structure of claim 11, wherein the walls of the switchbacks have a different width.

18. The structure of claim 11, further comprising extensions which are segmented from the switchbacks forming a discontinuous crackstop.

19. A crackstop structure comprising metal walls which switch back on themselves at plural sides and multiple times, and which are structured to behave electrically like a discontinuous crackstop.

20. The structure of claim 19, wherein the metal walls switch back at corners of the crackstop structure.

* * * * *